United States Patent
Ripley et al.

(10) Patent No.: US 8,514,016 B2
(45) Date of Patent: Aug. 20, 2013

(54) SINGLE DIE POWER AMPLIFIER WITH CLOSED LOOP POWER CONTROL

(75) Inventors: David S. Ripley, Marion, IA (US); Jamey D. Stroschine, Cedar Rapids, IA (US)

(73) Assignee: Skyworks Solutions, Inc., Woburn, WA (US)

( * ) Notice: Subject to any disclaimer, the term of this patent is extended or adjusted under 35 U.S.C. 154(b) by 0 days.

(21) Appl. No.: 13/008,231

(22) Filed: Jan. 18, 2011

(65) Prior Publication Data
US 2012/0182074 A1     Jul. 19, 2012

(51) Int. Cl.
*H03G 3/20* (2006.01)
(52) U.S. Cl.
USPC .......................................... 330/133; 330/297
(58) Field of Classification Search
USPC ................. 330/133–134, 296–297, 127, 310, 330/150
See application file for complete search history.

(56) References Cited

U.S. PATENT DOCUMENTS

| | | | | |
|---|---|---|---|---|
| 4,482,867 A | * | 11/1984 | Marchand et al. | 330/277 |
| 7,193,459 B1 | * | 3/2007 | Epperson et al. | 330/130 |
| 7,605,651 B2 | * | 10/2009 | Ripley et al. | 330/133 |
| 2002/0146993 A1 | | 10/2002 | Persico et al. | |
| 2007/0066250 A1 | | 3/2007 | Takahashi et al. | |

FOREIGN PATENT DOCUMENTS

| | | |
|---|---|---|
| EP | 0481741 | 4/1992 |
| EP | 0717492 | 6/1996 |
| WO | WO 2012/099891 | 7/2012 |

OTHER PUBLICATIONS

International Search Report and Written Opinion issued on Aug. 14, 2012 in related application No. PCT/US2012/021576, filed Jan. 17, 2012.

* cited by examiner

*Primary Examiner* — Hieu Nguyen
(74) *Attorney, Agent, or Firm* — Knobbe Martens Olson & Bear, LLP

(57) ABSTRACT

An apparatus on a single integrated circuit (IC) die includes a multiple stage power amplifier having at least first and second stages, a multiple stage voltage regulator for providing a regulated voltage signal to the at least first and second stages of the multiple stage power amplifier, a power coupler for providing a portion of a power output of the multiple stage power amplifier to a power detector, the power detector for developing a power detect signal, and a power control loop including at least the second stage and an output stage of the multiple stage power amplifier, the power coupler, the power detector, and at least one stage of the multiple stage voltage regulator, the power control loop controlling only the second stage and the output stage of the multiple stage power amplifier.

18 Claims, 3 Drawing Sheets

SINGLE DIE POWER AMPLIFIER WITH CLOSED LOOP POWER CONTROL

BACKGROUND

Portable communication devices, such as cellular telephones, personal digital assistants (PDAs), WiFi transceivers, and other communication devices transmit and receive communication signals at various frequencies that correspond to different communication bands and at varying power levels. Each of these devices uses a power amplifier to amplify the information signal for over-the-air transmission and some manner of power control to monitor and regulate the power output of the power amplifier. One such power amplifier and power control topology uses separate dies, also referred to as integrated circuit (IC) chips, for the power amplifier and for the power control circuitry. Locating the power amplifier and power control circuitry on separate dice provides a high degree of radio frequency (RF) isolation between the power amplifier and the power control circuitry. Additional isolation is provided by electrical bond wires that are used to electrically couple the power amplifier to the power control circuitry. A high degree of isolation between the power amplifier and the power control circuitry promotes a stable power control loop.

While multi-chip power amplification topologies have worked adequately, there is a move in the industry toward single-chip power amplifier topologies, which combine power amplification circuitry and power control circuitry on a single die. Unfortunately, combining a power amplifier and power control circuitry on a single die degrades the isolation between the power amplifier and power control circuitry and also makes accurate closed loop power control more problematic.

Therefore, there is a need for a single-die power amplification topology that overcomes the above-mentioned challenges.

SUMMARY

Embodiments of an apparatus on a single integrated circuit (IC) die include a multiple stage power amplifier having at least first and second stages, a multiple stage voltage regulator for providing a regulated voltage signal to the at least first and second stages of the multiple stage power amplifier, a power coupler for providing a portion of a power output of the multiple stage power amplifier to a power detector, the power detector for developing a power detect signal, and a power control loop including at least the second stage and an output stage of the multiple stage power amplifier, the power coupler, the power detector, and at least one stage of the multiple stage voltage regulator, the power control loop controlling only the second stage and the output stage of the multiple stage power amplifier.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable communication device, such as a portable cellular telephone or a personal digital assistant (PDA), the single die power amplifier with closed loop power control can be used in any device or system that has a collector voltage amplitude controller (COVAC) power amplifier topology. In an embodiment, the single die power amplifier with closed loop power control can be implemented as part of an integrated module that contains other circuit elements, or can be implemented as one or more discrete circuits within a power amplification module.

In an embodiment, the single die power amplifier with closed loop power control can be implemented in hardware. The hardware implementation of the single die power amplifier with closed loop power control can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

Figure 1:
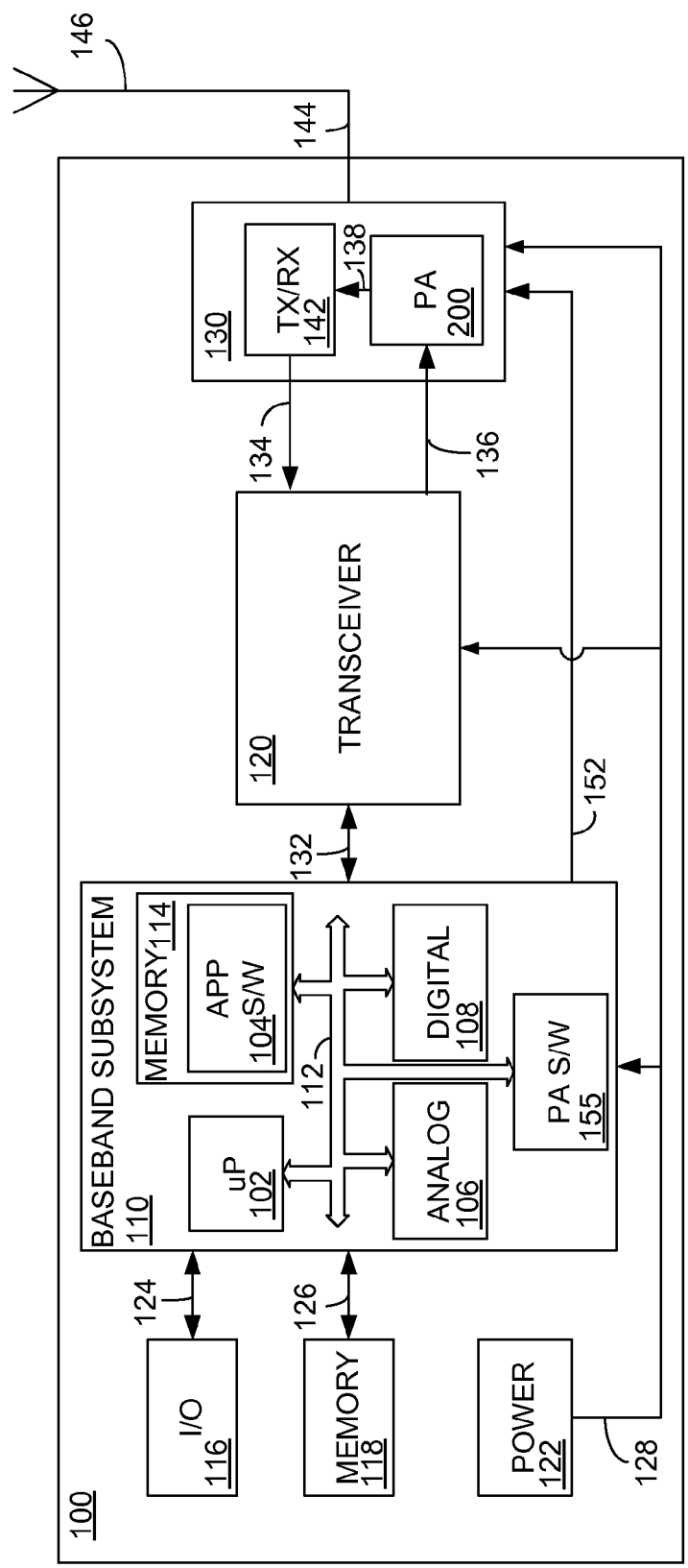
FIG. 1 is a block diagram illustrating a simplified portable communication device.

FIG. 1 is a block diagram illustrating a simplified portable communication device 100. In an embodiment, the portable communication device 100 can be a portable cellular telephone. Embodiments of the single die power amplifier with closed loop power control can be implemented in any device having an RF power amplifier, and in this example, are implemented in a portable communication device 100. The portable communication device 100 illustrated in FIG. 1 is intended to be a simplified example of a cellular telephone and to illustrate one of many possible applications in which the single die power amplifier with closed loop power control can be implemented. One having ordinary skill in the art will understand the operation of a portable cellular telephone, and, as such, implementation details are not shown herein. The portable communication device 100 includes a baseband subsystem 110, a transceiver 120, a front end module (FEM) 130 and a power amplifier (PA) module 200. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108, and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other devices or system that allow a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the single die power amplifier with closed loop power control are implemented in software, then the baseband subsystem 110 also includes power amplifier software 155, which may cooperate with control logic that can be executed by the microprocessor 102, or by another processor, to control the operation of at least portions of the power amplifier module 200 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a PA module 200. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the PA module 200. The output of the PA module 200 is provided over connection 138 to the TX/RX switch 142, and then to an antenna 146 over connection 144.

The PA module 200 includes power amplification circuitry and power control circuitry on a single die. In an embodiment, the PA module 200 receives a power control signal, which can be referred to as Vcontrol, from the baseband subsystem 110 over connection 152. The power control signal on connection 152 can be implemented in a variety of ways, and generally comprises an analog or a digital control signal that allows power control circuitry located within the PA module 200 to set the desired radio frequency (RF) output power provided on connection 138. An exemplary embodiment of the PA module 200 will be described in greater detail below.

A signal received by the antenna 146 is provided over connection 144 to the TX/RX switch 142, which provides the received signal over connection 134 to the transceiver 120. The transceiver 120 downconverts and decodes the received signal and provides an information signal to the baseband subsystem 110 over connection 132.

Figure 2:
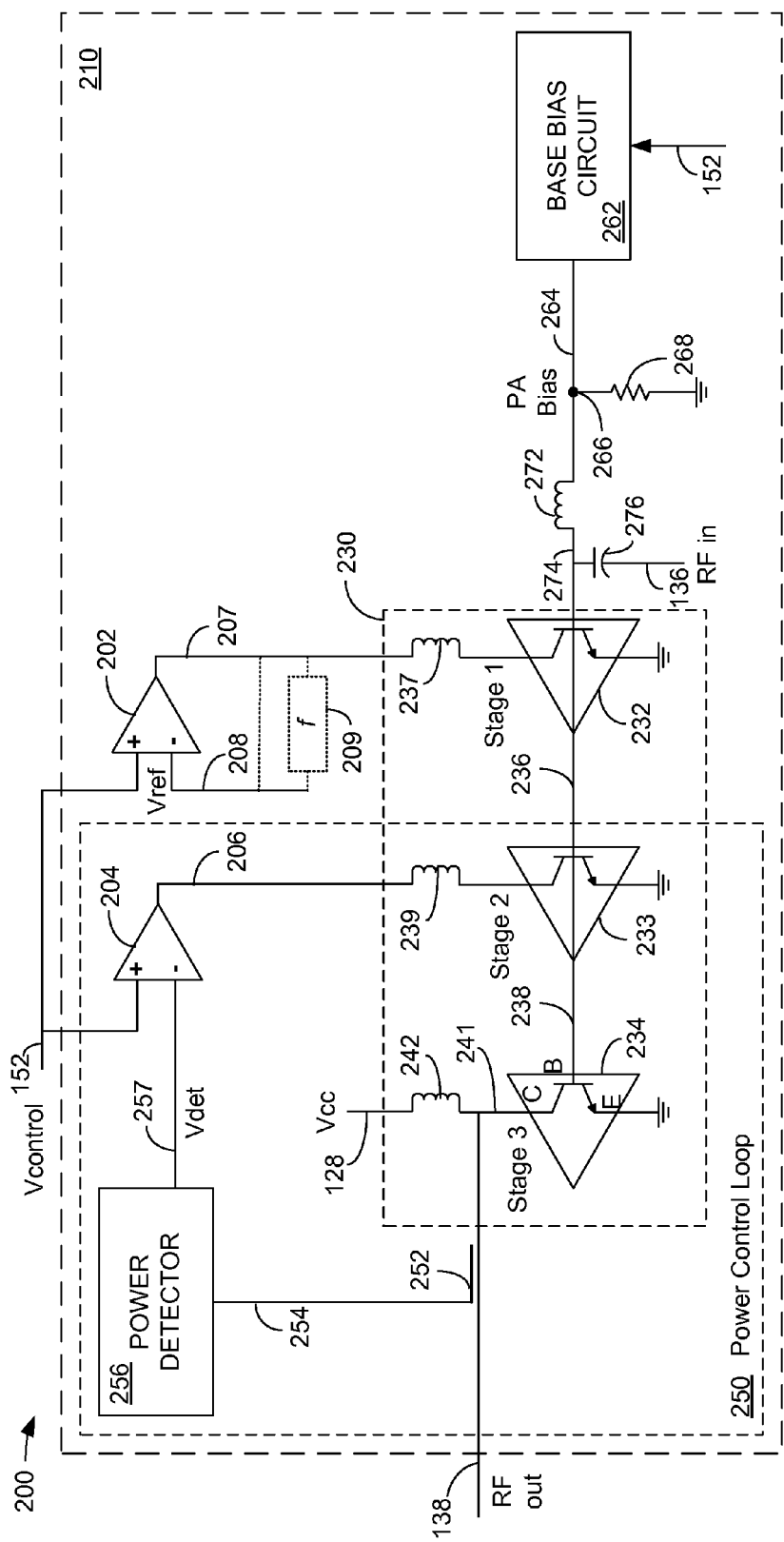
FIG. 2 is a diagram illustrating an embodiment of the power amplifier module of FIG. 1.

FIG. 2 is a diagram illustrating an embodiment of the power amplifier module 200 of FIG. 1. FIG. 2 illustrates only the portions of the power amplifier and power control circuitry that are relevant to the description of the single die power amplifier with closed loop power control.

When the power amplifier and its related power control circuitry are placed on a single die, the isolation between power amplifier stages and the power control circuitry is degraded. The integration of both power amplifier and power control circuitry onto a single die reduces the physical separation between the respective components and generally eliminates the bondwire connections between the power amplifier circuitry and the power control circuitry. Eliminating the bondwires degrades isolation between the power amplifier circuitry and the power control circuitry. While additional off-chip bypassing elements can be included to improve isolation, adding such components increases cost, complexity and increases the total die area.

The PA module 200 generally comprises a power amplifier 230, power control circuitry comprising a first stage voltage regulator 202 and a second stage voltage regulator 204, a power coupler 252 and a power detector 256 all located on a single die 210. The power amplifier 230 is typically implemented using two or more stages, and is shown in FIG. 2, for example only, as comprising a first power amplifier stage 232 (sometimes referred to as a driver stage), a second power amplifier stage 233 (sometimes referred to as a driver stage) and a third power amplifier stage 234 (sometimes referred to as an output stage). The implementation of the power amplifier 230 is referred to as a fully saturated hybrid COVAC in which the third power amplifier stage 234 operates as a fully saturated output amplifier and in which the first power amplifier stage 232 and the second power amplifier stage 233 are regulated according to regulated control signals received from the first stage regulator 202 and the second stage regulator 204, respectively.

In an embodiment, the first stage regulator 202 and the second stage regulator 204 are implemented with operational amplifiers. A control signal referred to as Vcontrol is provided from off-chip (e.g, from the baseband subsystem 110 over connection 152 in an embodiment) to the non-inverting inputs of the regulators 202 and 204. A reference voltage, Vref, is provided to the first stage regulator 202 over connection 208. The signal, Vref, provided on connection 208 is a function (e.g., scaled and/or level shifted) of the signal on connection 207. While this function is shown as being provided by element 209, it may also be implemented as a direct connection from connection 207 to connection 208 forming a unity gain buffer. Alternatively, the function provided by element 209 can comprise a resistive divider to introduce the gain of the signal on connection 152 to the signal on connection 207.

The output of the first stage regulator 202 is provided over connection 207 to the collector of the first power amplifier stage 232 through an inductor 237. The output of the second stage regulator 204 is provided over connection 206 to the collector of the second power amplifier stage 233 through an inductor 239. The regulators 202 and 204 control the direct current (DC) response of the first power amplifier stage 232 and the second power amplifier stage 233, respectively, based on the control voltage, Vcontrol.

The Vcontrol signal on connection 152 also serves as a voltage reference point for the power control loop 250. The waveform of the Vcontrol signal on connection 152 is shaped by the first stage regulator 202 to provide sufficient gain in the first power amplifier stage 232 to fully saturate the input to the second power amplifier stage 233.

The collector terminal 241 of the third amplifier stage 234 is connected to a supply voltage, which in this embodiment can be connection 128, which provides battery voltage, Vcc, through an inductor 242.

The power amplifier 230 also receives a base bias signal from bias circuit 262. The bias circuit 262 includes circuitry that is well know to those skilled in the art and provides a bias signal on connection 264, which is provided through an inductor 272 to the base 274 of the first power amplifier stage 232, the second power amplifier stage 233 and the third power amplifier stage 234.

A radio frequency (RF) input signal is provided from connection 136, through a DC blocking capacitor 276 to the base terminal 274 of the power amplifier 230. The output of the power amplifier 230 on connection 138 is taken from the collector terminal 241 of the third power amplifier stage 234.

A portion of the power on connection 138 is diverted by power coupler 252 onto connection 254 where it is provided as an input to the power detector 256. In an embodiment, the coupler 252 can be implemented as a laminate-based coupler.

In an embodiment, the power detector 256 may be implemented as a logarithmic detector having an approximate 60 dB performance range, or can be implemented as a linear detector. In an embodiment, the input of the power detector 256 is approximately −30 dB with respect to the signal on connection 138.

The output of the power detector 256 is provided over connection 257 as a detected power output signal, Vdetect. The Vdetect signal is provided to the inverting input of the regulator 204. As the input to the power detector 256 on connection 254 increases, the resultant output voltage, Vdetect, on connection 257 increases, thus closing the power control loop 250.

In accordance with an embodiment of the single die power amplifier having closed loop power control, the power control loop 250 comprises only the second stage regulator 204, second power amplifier stage 233, third power amplifier stage 234, power coupler 252 and power detector 256. The first stage regulator 202 is not part of the power control loop 250, and does not receive the Vdetect signal on connection 257. Providing each driver stage 232 and 233 with a separate regulated control signal from the first stage regulator 202 and the second stage regulator 204, respectively, buffers and isolates the Vcontrol signal on connection 152 from the respective collector terminals of the first power amplifier stage 232 and second power amplifier stage 233, thus improving isolation between the control voltage, Vcontrol, and the power amplifier 230. Omitting the first stage regulator 202 from the power control loop 250 removes any gain associated with the first stage regulator 202 from the power control loop 250, thus increasing loop stability because only a single power control loop is active. Further, separate control of the first power amplifier stage 232 and the second power amplifier stage 233 improves isolation by buffering the Vcontrol signal on connection 152 from the respective first and second power amplifier stages 232 and 233, and allows independent control of the two driver stages. The architecture of the PA module 200 results in a stable single die power amplifier with closed loop power control.

In a conventional multi-die COVAC power amplifier, both of the control voltages provided on connections 206 and 207 would be provided from a single voltage regulator and would be connected to the collector terminals of the $1^{st}$ and $2^{nd}$ stage power amplifier elements through respective bondwires. The bondwires provide high Q and good isolation if properly designed and implemented. However, in currently proposed power amplifier modules, the bondwires are not present between the control regulator and the $1^{st}$ and $2^{nd}$ stage power amplifier collector terminals.

In the architecture described in FIG. 2, as a first order element, the first stage regulator 202 performs an isolation function, which was previously accomplished with the bondwire connections between the silicon-based voltage regulator and the HBT power amplifier circuits. Additionally, in the architecture described in FIG. 2, the $1^{st}$ stage of the power amplifier, i.e., the first power amplifier stage 232, is removed from the power control loop 250, thereby reducing the number of feedback nodes and the potential of power amplifier instability. By removing the control signal on connection 207 from the power control loop 250, the isolation requirement between the power detector input on connection 254 and the first stage regulator 202 is reduced. Further, locating the first stage regulator 202 outside of the power control loop 250 provides additional isolation between the Vdet signal on connection 257 and the control signal on connection 207.

Further still, for a three stage power amplifier, there are multiple feedback points or mechanisms, between the power detector circuit 256 and the amplifier stages of the power amplifier. Each of the feedback mechanisms affect the stability of the power amplifier in different ways, so caution is taken on the circuit trace routing of the integrated circuit (IC) and multi-chip module (MCM) to minimize the coupling of RF energy between the output 138 and all of the feedback points. Some of these feedback points are more critical than others, due to the phase at which the feedback is applied to the power control loop 250. By removing the first power amplifier stage 232 from the power control loop 250, at least one of the major feedback contributors is removed, thereby easing the design requirements with regard to amplifier stability. The first stage regulator 202 helps to further isolate the first power amplifier stage 232 from the stability/noise perspective, by providing isolation between $1^{st}$ stage and $2^{nd}$ stage amplifier control.

Figure 3:
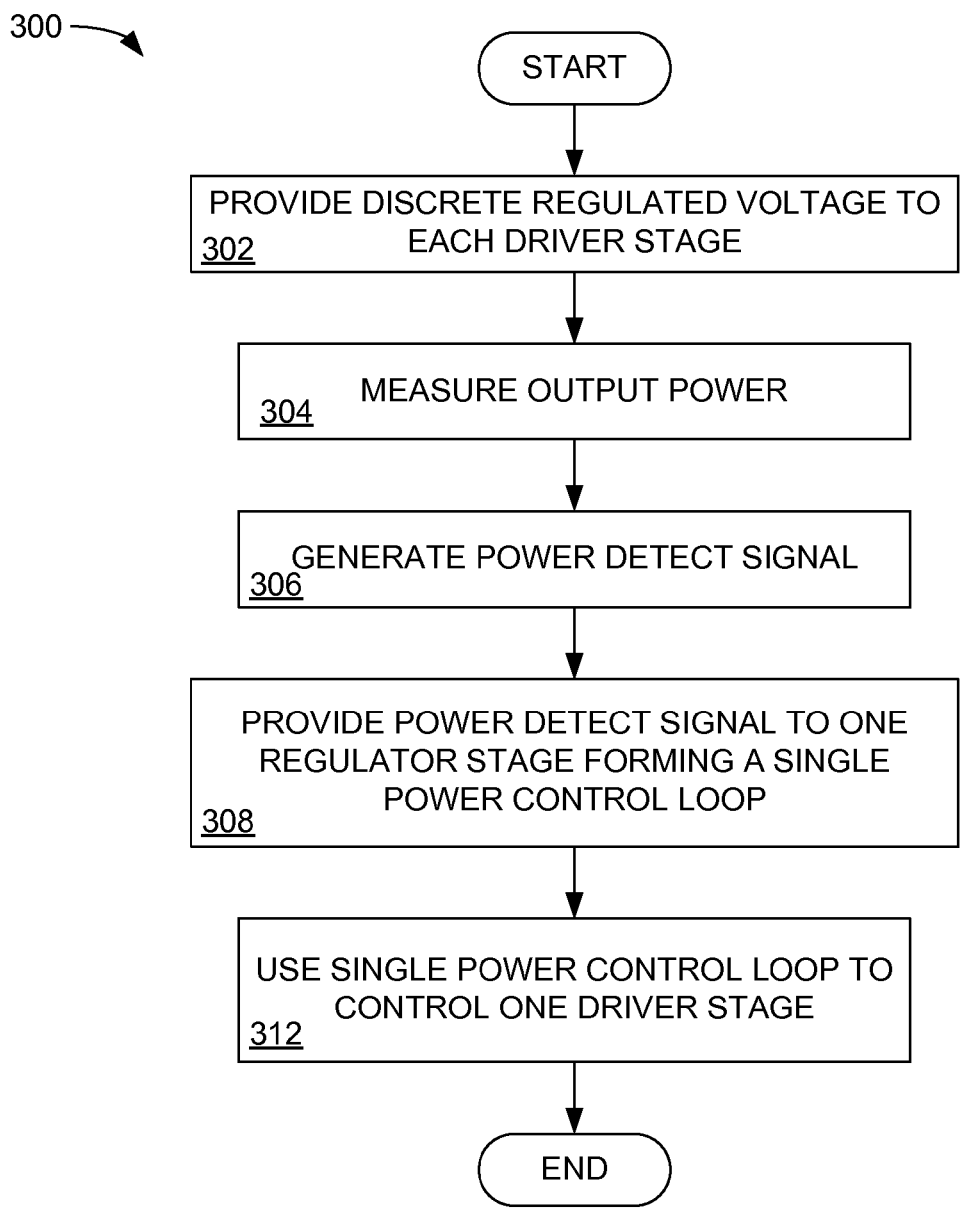
FIG. 3 is a flow chart illustrating an embodiment of a method for operating a single die power amplifier with closed loop power control.

FIG. 3 is a flow chart illustrating an embodiment of a method for operating a single die power amplifier with closed loop power control. The blocks in the flow chart illustrate an exemplary method and can be performed in or out of the order shown. Some of the steps of the method for operating a single die power amplifier with closed loop power control can be executed in software as known in the art.

In block 302, a regulated voltage based on a power control signal, Vcontrol, is separately provided via discrete regulators 202 and 204 to the first power amplifier stage 232 and to the second power amplifier stage 233, respectively.

In block 304, the power detector 256 measures the power amplifier output power on connection 138.

In block 306, the power detector 256 generates a power detect signal, Vdetect, on connection 257.

In block 308 the power detect signal, Vdetect, is provided only to the second stage regulator 204, thus closing the power control loop 250.

In block 312, the power control loop 250 controls only the second power amplifier stage 233.

While various embodiments of the invention have been described, it will be apparent to those of ordinary skill in the art that many more embodiments and implementations are possible that are within the scope of the invention. For example, the invention is not limited to a specific type of communication device or transceiver. Embodiments of the invention are applicable to different types of communication devices and transceivers.

What is claimed is:

1. An apparatus on a single integrated circuit (IC) die, comprising:
    a multiple stage power amplifier having at least a first stage, a second stage, and an output stage;
    a multiple stage voltage regulator configured to provide a regulated voltage signal to at least the first and second stages of the multiple stage power amplifier;
    a power coupler configured to provide a portion of a power output of the multiple stage power amplifier to a power detector, the power detector configured to develop a power detect signal; and
    a power control loop including at least the second stage and the output stage of the multiple stage power amplifier, the power coupler, the power detector, and at least one stage of the multiple stage voltage regulator, the power control loop configured to control only the second stage and the output stage of the multiple stage power amplifier.

2. The apparatus of claim 1 wherein at least two stages of the multiple stage voltage regulator independently control respective first and second stages of the multiple stage power amplifier.

3. The apparatus of claim 2 wherein the at least two stages of the multiple stage voltage regulator each develop a voltage gain and only a gain developed by a second stage of the multiple stage voltage regulator is applied to the power control loop.

4. The apparatus of claim 3 wherein each of the at least two stages of the multiple stage power amplifier is controlled by a corresponding respective stage of the multiple stage voltage regulator.

5. The apparatus of claim 1 wherein a first stage of the multiple stage voltage regulator controls a respective first stage of the multiple stage power amplifier independent of a power control loop.

6. A portable communication device, comprising:
    a transmitter configured to develop a radio frequency (RF) signal;
    a multiple stage power amplifier configured to amplify the RF signal and having at least a first stage, a second stage, and an output stage;
    a multiple stage voltage regulator configured to provide a regulated voltage signal to the at least first and second stages of the multiple stage power amplifier;
    a power coupler configured to provide a portion of a power output of the multiple stage power amplifier to a power detector, the power detector configured to develop a power detect signal; and
    a power control loop including at least the second stage and the output stage of the multiple stage power amplifier, the power coupler, the power detector, and at least one stage of the multiple stage voltage regulator, the power control loop configured to control only the second stage and the output stage of the multiple stage power amplifier.

7. The portable communication device of claim 6 wherein at least two stages of the multiple stage voltage regulator independently control respective first and second stages of the multiple stage power amplifier.

8. The portable communication device of claim 7 wherein the at least two stages of the multiple stage voltage regulator each develop a voltage gain and only a gain developed by a second stage of the multiple stage voltage regulator is applied to the power control loop.

9. The portable communication device of claim 8 wherein each of the at least two stages of the multiple stage power amplifier is controlled by a corresponding respective stage of the multiple stage voltage regulator.

10. The portable communication device of claim 6 wherein a first stage of the multiple stage voltage regulator controls a respective first stage of the multiple stage power amplifier independent of a power control loop.

11. The apparatus of claim 1 wherein the IC die includes a silicon-germanium (SiGe) die.

12. The apparatus of claim 11 wherein the IC includes at least one CMOS device.

13. The portable communication device of claim 6 wherein the multiple stage power amplifier, the multiple stage voltage regulator, the power coupler, and the power control loop are provided on a single integrated circuit (IC) die.

14. A method of fabricating an integrated circuit (IC) device, the method comprising:
    forming, on a semiconductor substrate, a multiple stage power amplifier having at least a first stage, a second stage, and an output stage;
    forming, on the semiconductor substrate, a multiple stage voltage regulator for providing a regulated voltage signal to at least the first and second stages of the multiple stage power amplifier;
    forming, on the semiconductor substrate, a power coupler for providing a portion of a power output of the multiple stage power amplifier to a power detector, the power detector for developing a power detect signal;
    forming, on the semiconductor substrate, a power control loop including at least the second stage and an output stage of the multiple stage power amplifier, the power coupler, the power detector, and at least one stage of the multiple stage voltage regulator, the power control loop controlling only the second stage and the output stage of the multiple stage power amplifier; and
    generating a die that includes the multiple stage power amplifier, the multiple stage voltage regulator, the power coupler, and the power control loop formed on the semiconductor substrate.

15. The method of claim 14 wherein at least two stages of the multiple stage voltage regulator independently control respective first and second stages of the multiple stage power amplifier.

16. The method of claim 15 wherein the at least two stages of the multiple stage voltage regulator each develop a voltage gain and only a gain developed by a second stage of the multiple stage voltage regulator is applied to the power control loop.

17. The method of claim 16 wherein each of the at least two stages of the multiple stage power amplifier is controlled by a corresponding respective stage of the multiple stage voltage regulator.

18. The method of claim 14 wherein a first stage of the multiple stage voltage regulator controls a respective first stage of the multiple stage power amplifier independent of a power control loop.

* * * * *